United States Patent
Lovett

(10) Patent No.: US 7,272,065 B2
(45) Date of Patent: Sep. 18, 2007

(54) COMPENSATED REFRESH OSCILLATOR

(76) Inventor: Simon Lovett, 13274 W. Passage Ct., Boise, ID (US) 83707-0006

( * ) Notice: Subject to any disclaimer, the term of this patent is extended or adjusted under 35 U.S.C. 154(b) by 393 days.

(21) Appl. No.: 10/726,439

(22) Filed: Dec. 3, 2003

(65) Prior Publication Data
US 2005/0125597 A1 Jun. 9, 2005

(51) Int. Cl.
*G11C 7/00* (2006.01)

(52) U.S. Cl. ............ 365/222; 365/185.24; 365/185.25; 711/106

(58) Field of Classification Search ................ 365/222, 365/185.24, 185.25; 711/106
See application file for complete search history.

(56) References Cited

U.S. PATENT DOCUMENTS

| | | | | |
|---|---|---|---|---|
| 5,392,251 A | * | 2/1995 | Manning | ..................... 365/222 |
| 5,784,328 A | * | 7/1998 | Irrinki et al. | ................ 365/222 |
| 6,154,408 A | * | 11/2000 | Yuh | ............................ 365/222 |
| 6,304,148 B1 | * | 10/2001 | Nomura et al. | ................ 331/57 |
| 6,483,764 B2 | * | 11/2002 | Chen Hsu et al. | ........... 365/222 |
| 6,714,473 B1 | * | 3/2004 | Fiscus | ......................... 365/222 |
| 2002/0196692 A1 | * | 12/2002 | Fiscus | ......................... 365/222 |

* cited by examiner

*Primary Examiner*—Richard T. Elms
*Assistant Examiner*—Eric Wendler
(74) *Attorney, Agent, or Firm*—Williams, Morgan & Amerson, P.C.

(57) ABSTRACT

A method and apparatus is provided for implementing a refresh rate control scheme that is capable of compensating for external factors. Using a circuit, a change in a current leakage relating to at least a portion of a memory device is detected. Furthermore, a refresh rate associated with the portion of the memory device is adjusted in response to detecting the current leakage.

56 Claims, 7 Drawing Sheets

COMPENSATED REFRESH OSCILLATOR

BACKGROUND OF THE INVENTION

1. Field of the Invention

This invention relates generally to a semiconductor memory device, and, more specifically, to providing a refresh oscillator scheme that is capable of compensating for external factors, such as voltage, temperature, and process.

2. Description of the Related Art

Modern integrated circuit devices are comprised of millions of semiconductor devices, e.g., transistors, formed above a semiconductor substrate, such as silicon. These devices are very densely packed, i.e., there is little space between them. Similarly, densely packed electrically conducting lines may also be formed in the semiconductor substrate. By forming selected electrical connections between selected semiconductor devices and selected conducting lines, circuits capable of performing complex functions may be created. For example, bits of data may be stored by providing electrical current to a plurality of bit lines and an orthogonal plurality of wordlines that may be electrically coupled to one or more capacitors in a semiconductor memory.

The semiconductor memory may be a dynamic random access memory, a flash memory, and the like. The semiconductor memory typically comprises an array of memory cells, address decoding circuitry for selecting one, or a group, of the memory cells for reading or writing data, sensing circuitry for detecting the digital state of the selected memory cell or memory cells, and input/output lines to receive the sensed data and convey that information for eventual output from the semiconductor memory. In many cases, the array of memory cells will be sub-divided into several sub-arrays, or subsets, of the complete collection of memory cells. For example, a semiconductor memory having 16 megabits ($2^{24}$ bits) of storage capacity, may be divided into 64 sub-arrays, each having 256K ($2^{18}$) memory cells.

Many of today's memory devices, such as Synchronous RAM (SDRAM), double data rate RAM devices (DDR RAM), and the like, require intricate timing schemes for proper operation. Important timing functions include proper implementation of refresh cycles that are used to maintain the integrity of the data stored in memory. Many times, memory devices and other electronic devices may utilize refresh-type circuitry that refreshes a memory cell to maintain memory integrity. However, the refresh rates and operation of maintaining memory integrity may be affected by external factors such as temperature variations, operating voltage, the type of processes used to manufacture memory devices, etc.

Designers of electronic devices, e.g., memory devices, have to consider a variety of voltage ranges and temperature ranges when designing circuits that form the devices. For example, the refresh rates may be predetermined by the upper or lower boundary thresholds of temperature ranges that are used to qualify the operating range of the devices. Often, these temperature ranges include an upper boundary of 85° C. Therefore, refresh cycles that are designed to operate at upper temperature boundaries, e.g., 85° C., may not provide for an efficient design for normal use in lower temperature ranges. Therefore, excessive amounts of power may be consumed when refresh rates are implemented to operate in the extreme range of temperature and operating voltage tolerances.

Generally, as the temperature rises, the memory cells in a memory device may experience a loss of ability to hold a charge because current leakage may be induced by higher temperatures. Often, refresh rates are implemented to accommodate higher temperatures, however at lower temperatures, the same higher refresh rates are used; thereby increasing standby current unnecessarily and causing excessive power consumption.

Power consumption is an important factor in electronic devices. It is desirable to reduce power consumption when implementing certain applications. In particular, wireless and battery operated equipment require lower power consumption designs in order to operate efficiently. Also, there is a drive to design smaller and more efficient electronic circuitry for many devices, such as PDAs, wireless telephones, cellular phones, portable computers, portable sensors and a variety of electronic equipment that generally require low power-consumption. The industry lacks an efficient way to improve the operation of refresh rates across many factors, such as temperature, voltage, and process variations.

The present invention is directed to overcoming, or at least reducing, the effects of, one or more of the problems set forth above.

SUMMARY OF THE INVENTION

In one aspect of the present invention, a device is provided for implementing a refresh rate control scheme that is capable of compensating for external factors. The device of the present invention includes a circuit for performing an approximation of a current leakage associated with at least a portion of the device. Since the refresh rate is a significant contributor to the standby power consumed by memories (e.g., DRAM-based memories), an efficient method to control the refresh rate with temperature variations may lead to appreciable standby power savings at lower temperatures. Accordingly, the device includes a refresh rate control unit operatively coupled with the circuit. The refresh rate control unit includes a refresh oscillator. The refresh rate control unit is adapted to adjust a refresh rate associated with at least a portion of the device in response to the approximation of the current leakage.

In another aspect of the present invention, a circuit is provided for controlling a refresh rate associated with at least a portion of memory device. The circuit of the present invention includes a transistor to provide a first input signal. The circuit also includes a cell leakage model operatively coupled to the transistor. The cell leakage model is adapted to model a current leakage associated with at least a portion of the device. The circuit also includes a comparator that is adapted to compare the first input signal to a reference input signal and a delay unit operatively coupled to the comparator. The delay unit is adapted to provide a delay upon an output from the comparator to provide a time period for pre-charging of the transistor and to provide a signal for controlling the refresh rate. The circuit also includes a refresh control oscillator operatively coupled to the delay block. The refresh control oscillator is adapted to provide a refresh rate for refreshing at least a portion of the memory device.

In another aspect of the present invention, a system board is provided for implementing a refresh rate control scheme that is capable of compensating for external factors. The system board includes a processor. The system board also includes a memory device operatively coupled to the processor. The memory device includes a leakage model circuit for performing an approximation of a current leakage associated with a portion of the device. The memory device also includes a refresh rate control unit operatively coupled with the leakage model circuit, the refresh rate control unit comprising a refresh oscillator. The refresh rate control unit is adapted to adjust a refresh rate associated with at least a portion of the memory device in response to the approximation of the current leakage.

In yet another aspect of the present invention, a method is provided for implementing a refresh rate control scheme that is capable of compensating for external factors. A change in a current leakage relating to at least a portion of a memory device is detected. A refresh rate associated with the portion of the memory device is adjusted in response to detecting the current leakage.

In yet another aspect of the present invention, a computer readable program storage device encoded with instructions is provided for implementing a refresh rate control scheme that is capable of compensating for external factors. A computer readable program storage device encoded with instructions that, when executed by a computer, performs a method, which comprises: detecting a change in a current leakage relating to at least a portion of a memory device; and adjusting a refresh rate associated with the portion of the memory device in response to detecting the current leakage.

In yet another aspect of the present invention, a computer system is provided for implementing a refresh rate control scheme that is capable of compensating for external factors. The computer system includes a display device and a computer unit operatively coupled to the display device. The computer unit comprising a system board, which includes a system board that comprises a processor and a memory device operatively coupled to the processor. The memory device includes a leakage model circuit for performing an approximation of a current leakage associated with a portion of the device. The memory device also includes a refresh rate control unit operatively coupled with the leakage model circuit. The refresh rate control unit includes a refresh oscillator. The refresh rate control unit is adapted to adjust a refresh rate associated with at least a portion of the memory device in response to the approximation of the current leakage.

BRIEF DESCRIPTION OF THE DRAWINGS

The invention may be understood by reference to the following description taken in conjunction with the accompanying drawings, in which like reference numerals identify like elements, and in which.

Figure 1:
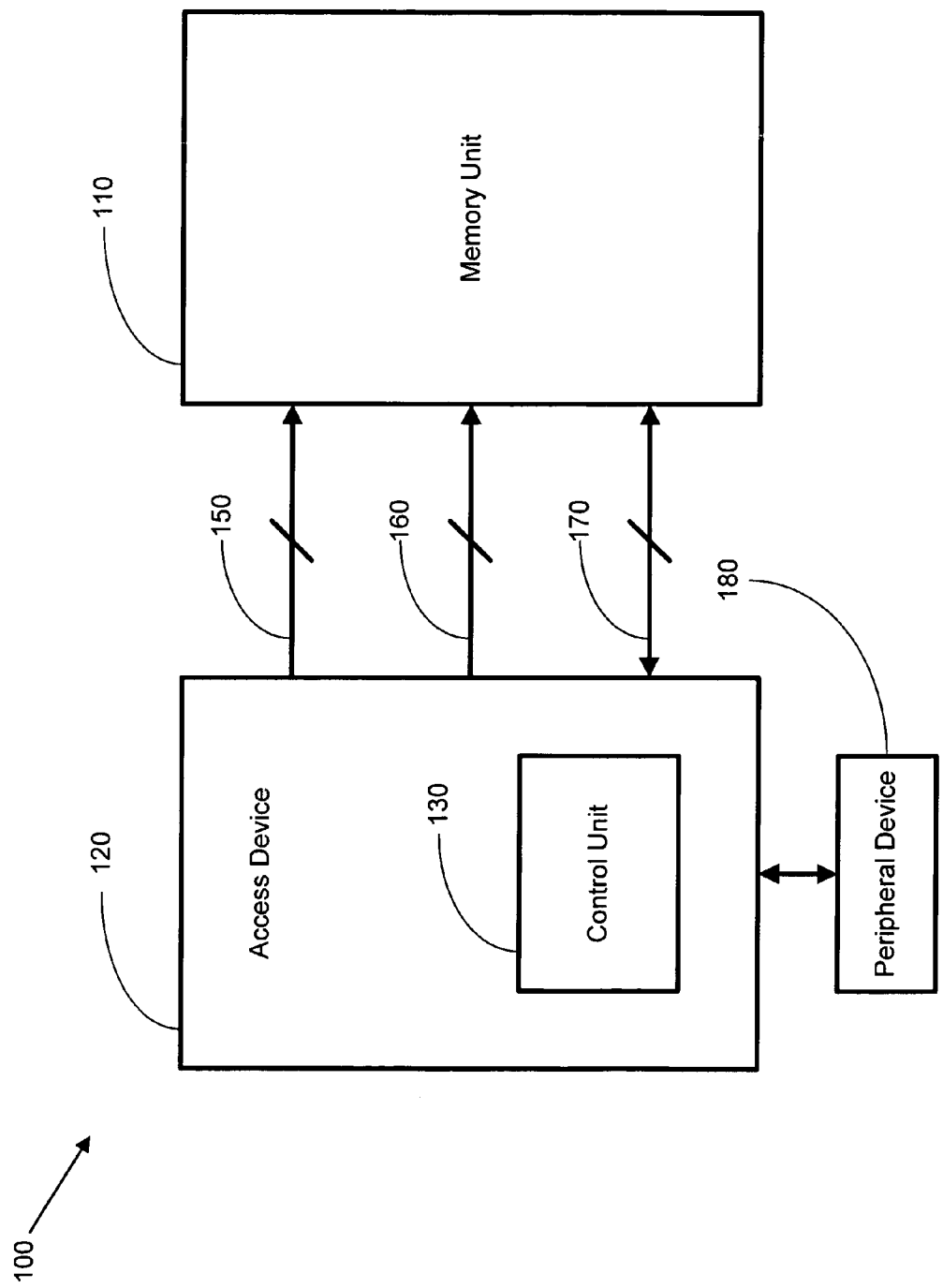
FIG. 1 illustrates a block diagram of a system including a device that is capable of accessing and/or testing a memory, in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Embodiments of the present invention provide for a refresh control circuit that is capable of adjusting the refresh cycle in an electronic device, such as a memory device. In response to temperature, process variations, and/or voltage supply variations, a predetermined worst-case scenario for implementing refresh rates are generally provided in memory devices. Embodiments of the present invention provide for a dynamic adjustment of a refresh rate implementation based upon a variety of external factors such as changes in temperature, changes in operating voltage, process variations relating to processes used to generate or develop the devices, and the like. A model is provided for modeling the approximate current leakage experienced by one or more components of a device, such as a memory cell in a memory device. Based upon this modeling, the refresh rate is reactively adjusted. A refresh oscillator may be modified based upon an estimation of current leakage at a given range of temperatures, operating voltage, and/or process variations.

Referring to FIG. 1, a block diagram of a system 100 is illustrated, in accordance with one embodiment of the present invention. The system 100 comprises a memory unit 110 capable of storing data, which may be accessed by an access device 120. The access device 120 comprises a control unit 130 capable of accessing data stored in the memory unit 110. The access device 120 may be any device that uses the memory unit 110 to store data, read data, or both. Examples of the access device 120 may include, but are not limited to, a computer unit such as desktop or portable computer, a camera, a telephone, a cellular phone, a television, a radio, a calculator, a personal digital assistant (PDA), a network switch, a setup-box, and the like. The access device 120 may be coupled to a peripheral device 180, which may be a display device, such as a monitor, or a variety of devices, such as a CD-RW device, a DVD device, a storage device, and the like.

The control unit 130, in one embodiment, may manage the overall operations of the access device 120, including writing and reading data to and from the memory unit 110. The control unit 130 may comprise a microprocessor, a microcontroller, a digital signal processor, a processor card (including one or more microprocessors or controllers), a memory controller, or other control or computing devices.

Figure 2:
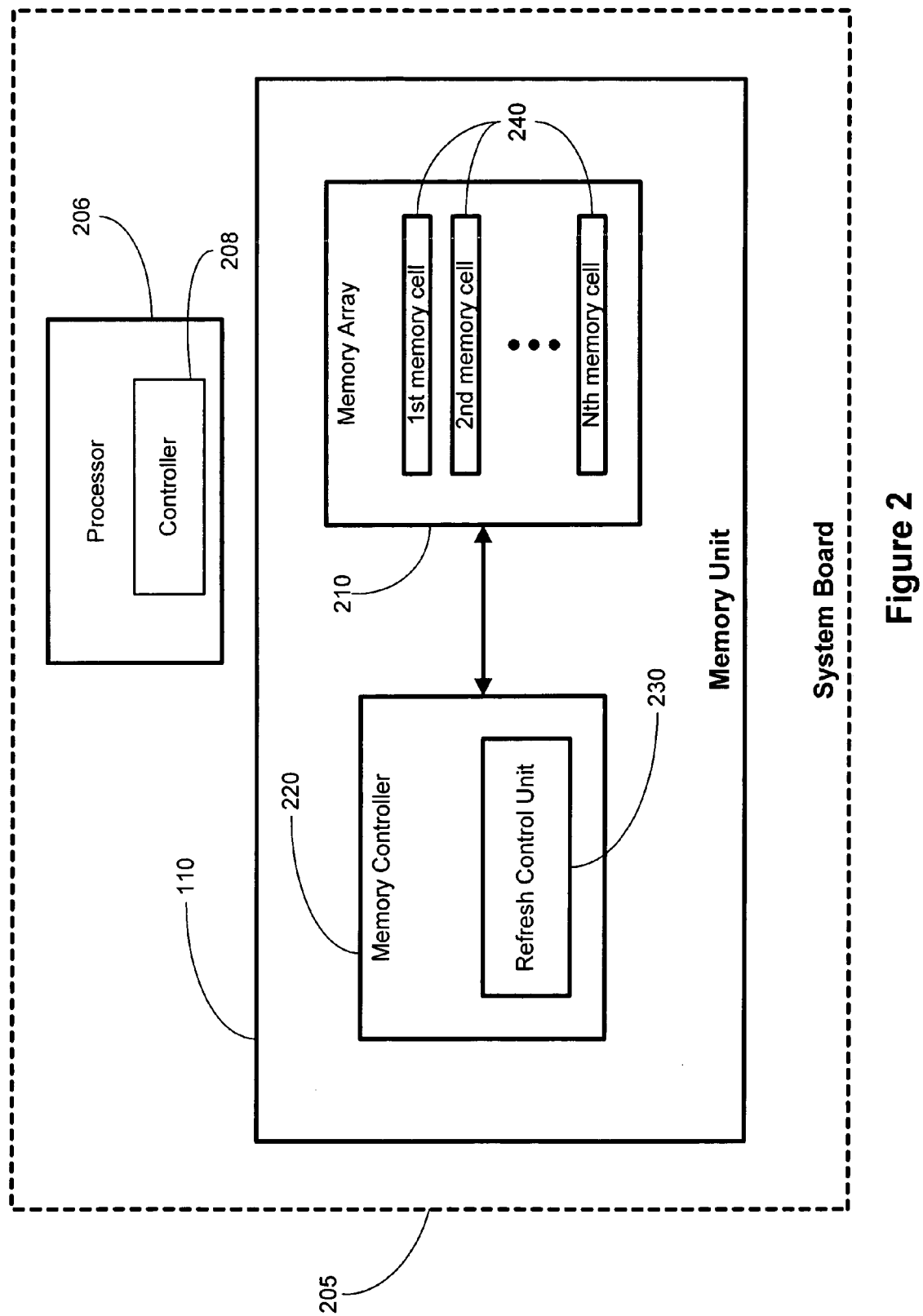
FIG. 2 illustrates a block diagram of the memory unit of FIG. 1, in accordance with one illustrative embodiment of the present invention.

The memory unit 110 in the illustrated embodiment is a non-volatile memory, such as flash memory. In one embodiment, the memory unit 110 may be an external memory, such as a memory stick, and may be accessed when inserted into a slot (not shown) of the access device 120. When inserted into the access device 120, the access device 120 provides the appropriate power and control signals to access memory locations in the memory unit 110. The memory unit 110 may be external to, or internal (e.g., integrated) to, the access device 120. The access device 120, such as a computer system, may employ a memory unit 110 that is integrated within the computer system to store data (e.g., BIOS [basic input/output system]) related to the computer system. In one embodiment, the memory unit 110 may be a dynamic random access memory (DRAM), a double-data rate synchronous DRAM (DDR SDRAM), a Rambus™ DRAM (RDRAM), a FLASH memory unit, or the like. As shown in FIG. 2, the memory unit 110 may be part of a system board 205 that includes a processor 206. The system board 205 may be a motherboard that is utilized in a variety of types of computer systems, such as an IBM compatible computer system, a workstation computer system, a mainframe computer system, an Apple computer system, a portable computer, a PDA, and the like.

Turning now to FIG. 2, a block diagram representation of the memory device/unit 110 of FIG. 1 is illustrated. The memory unit 110 may comprise a memory array 210 and a memory controller 220. The memory array 210 may contain one or more memory cell 240. The memory array 210 may comprise a plurality of memory cells 240 ($1^{st}$ through $N^{th}$ memory cells 240) that are capable of storing data. The memory controller 220 is a controller that is part of the memory device 110. The memory controller 220 is capable of receiving and executing memory access functions in response to instructions from the processor 106, which contain its own controller 208 to access memory in the memory device 110. In one embodiment, the access device 120 of FIG. 1 may access the memory unit 110 via a memory controller 220. Referring again to FIG. 1, the memory unit 110 may receive control signals across control lines 150 from the control unit 130 to control access to the memory array 210 of FIG. 2. Access to the memory array 210 may be directed to the one or more memory cell 240 in response to address signals received across address lines 160. Once accessed, data from the memory array 210 may be written to or read from the memory array 210 across data lines 170. In one embodiment, the memory controller 220 may comprise a refresh control unit 230 to control the refresh cycles performed by the memory device 110. The refresh control unit 230 is capable of reactively adjusting the refresh cycle in response to a given range of temperatures, operating voltage, and/or process variations. A more detailed description of the refresh control unit 230 is provided below.

Figure 3:
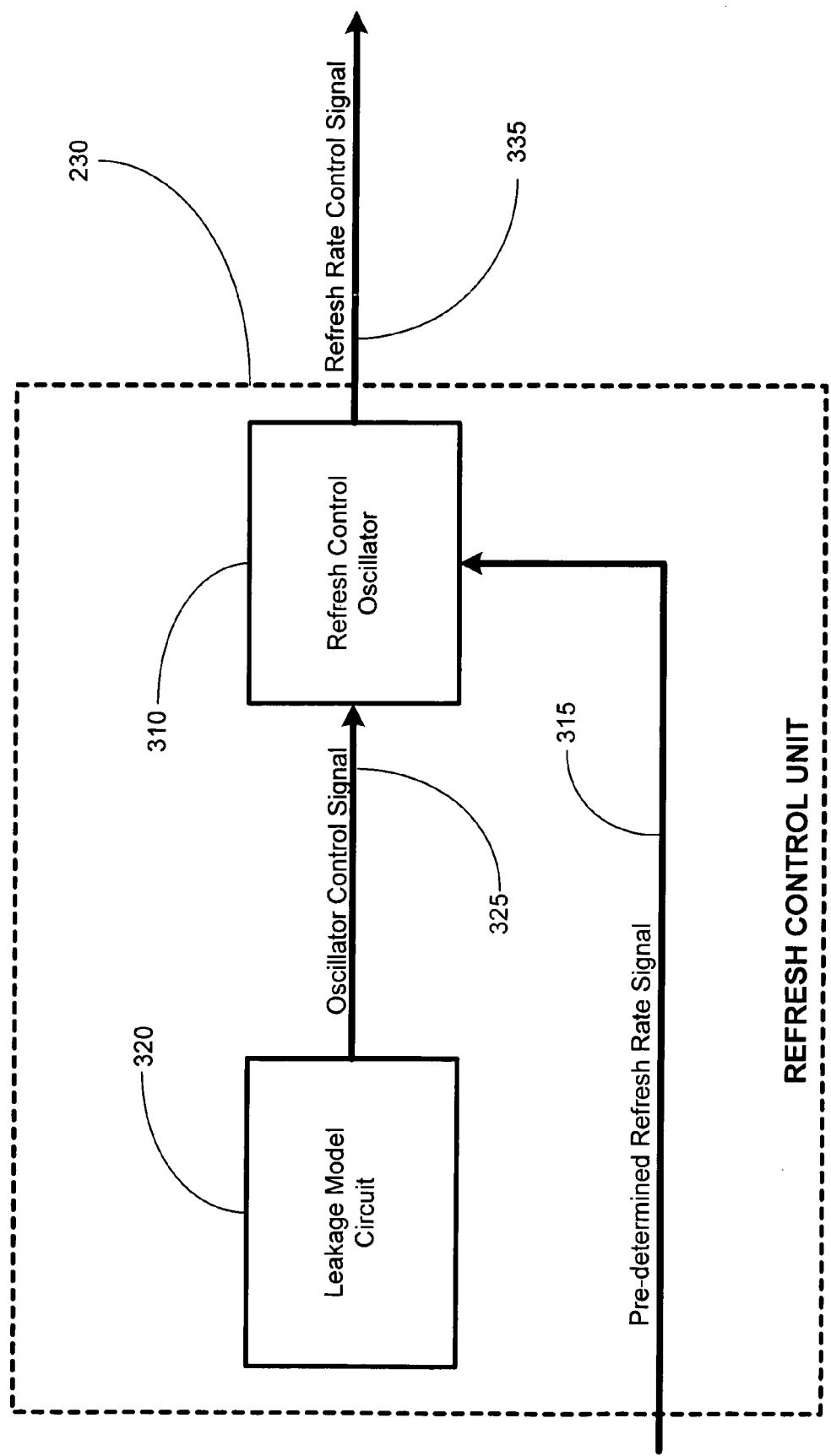
FIG. 3 illustrates a more detailed block diagram depiction of a refresh control unit of FIG. 2, in accordance with one illustrative embodiment of the present invention.

Turning now to FIG. 3, a more detailed block diagram illustration of one embodiment of implementing the refresh control unit 230 is provided. The refresh control unit 230 may comprise a leakage model circuit 320 that influences the refresh operation of a refresh control oscillator 310. The leakage model circuit 320 is capable of generating an oscillator control signal on a line 325. The oscillator control signal on the line 325 may be used to control the frequency of the refresh cycles that may be implemented in a memory device 110. Generally, the higher the frequency of the refresh cycle, the more power that the memory device 110 consumes. Therefore, instead of implementing a worst-case refresh cycle that ensures proper memory device 110 operation at extreme temperatures or other conditions, a reactive adjustment of the frequency of the refresh cycle may be implemented. Therefore, during normal temperature and/or voltage ranges, a more efficient refresh cycle may be implemented, and during extreme conditions, such as high temperature ranges, appropriate refresh cycles may be implemented, thereby promoting many advantages, such as power savings.

The oscillator control signal on the line 325 may be used to control the oscillator operation of the refresh control oscillator 310. Generally, the refresh control oscillator 310 may receive a predetermined refresh rate signal on a line 315, which is used to generate a refresh rate control signal on a line 335. The refresh rate control signal on the line 335 may be used by the memory controller 220 to control the refresh operation in order to maintain the memory-integrity of data stored in the memory array 210. Based upon external changes, such as temperature changes, voltage changes, and/or intrinsic variations, such as process variations, the leakage model circuit 320 may modify the operation of the refresh control oscillator 310 by providing an updated oscillator control signal on the line 325. For example, if the temperature is low, such that a less frequent refresh is required to maintain the memory data-integrity in the memory array 210, the leakage model circuit 320 will provide an oscillator control signal on the line 325 that prompts the refresh control oscillator 310 to reduce its rate of oscillation. Therefore, via the refresh rate control signal on the line 335, the rate of refresh is reduced. The refresh control unit 230 is capable of adaptively adjusting the refresh rate by which the memory controller 220 refreshes the memory in the memory array 210.

Figure 4:
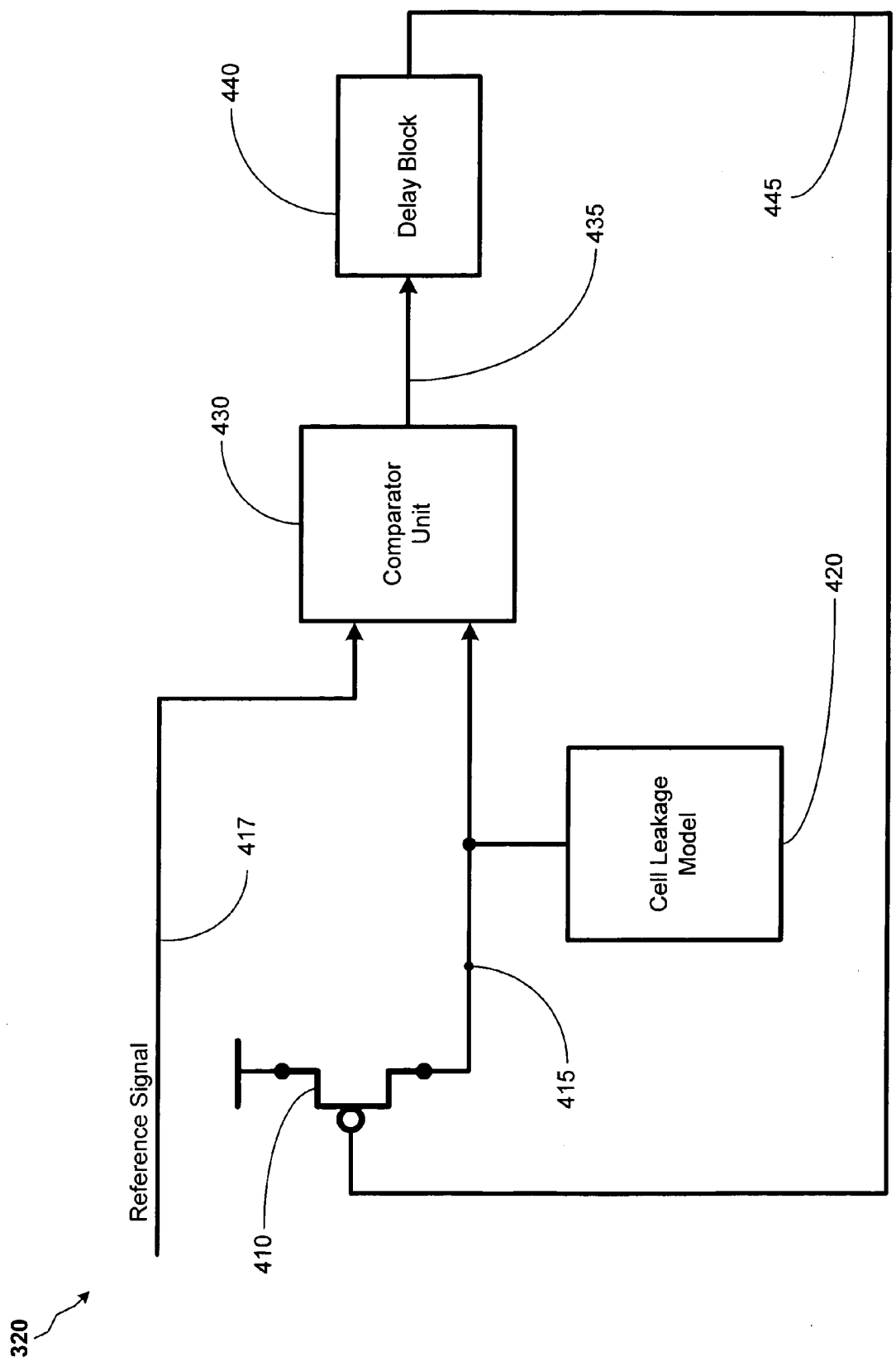
FIG. 4 illustrates a more detailed block diagram depiction of a leakage model circuit of FIG. 3, in accordance with one illustrative embodiment of the present invention.

Turning now to FIG. 4, a more detailed block diagram depiction of the leakage model circuit 320 is illustrated. The leakage model circuit 320 may comprise a P-channel pull-up transistor 410 that provides a signal to a cell leakage model 420 via a line 415. The P-channel transistor 410 may be pulled up to a supply voltage (e.g., $V_{cc}$). Alternatively, an N-channel pull-up may be implemented. Line 415 comprises a signal that provides an indication of the memory cell leakage experienced by memory cell 240 in the memory array 210. Therefore, if the temperature changes, the voltage or other external factors may cause a change in the operation of the memory device 110 as a result of various factors, such as current leakage (e.g., temperature-induced current leakage) associated with the memory cell 240. The cell leakage model 420 is able to model the behavior of the approximate current leakage experienced by various memory cells 240 in the memory array 210. The delay block/unit 440 is provided to generate a delay to allow the reset pulse on the pull-up device 410. The comparator unit 430 is used as a comparator reference voltage comparator to determine the point where the node A (line 415) drops below the reference voltage. The reference voltage may be adjusted to perform different calibrations used to adjust the refresh rate of the memory device 110.

In an alternative embodiment, the P-channel transistor 410 may be replaced with an N-channel transistor. However, the pull-up would not precharge to the supply voltage $V_{cc}$ since there would be a diode drop in the N-channel transistor. Therefore, the precharge would be maximam of $V_{cc}$ minus the threshold of the N-channel transistor.

Figure 5:
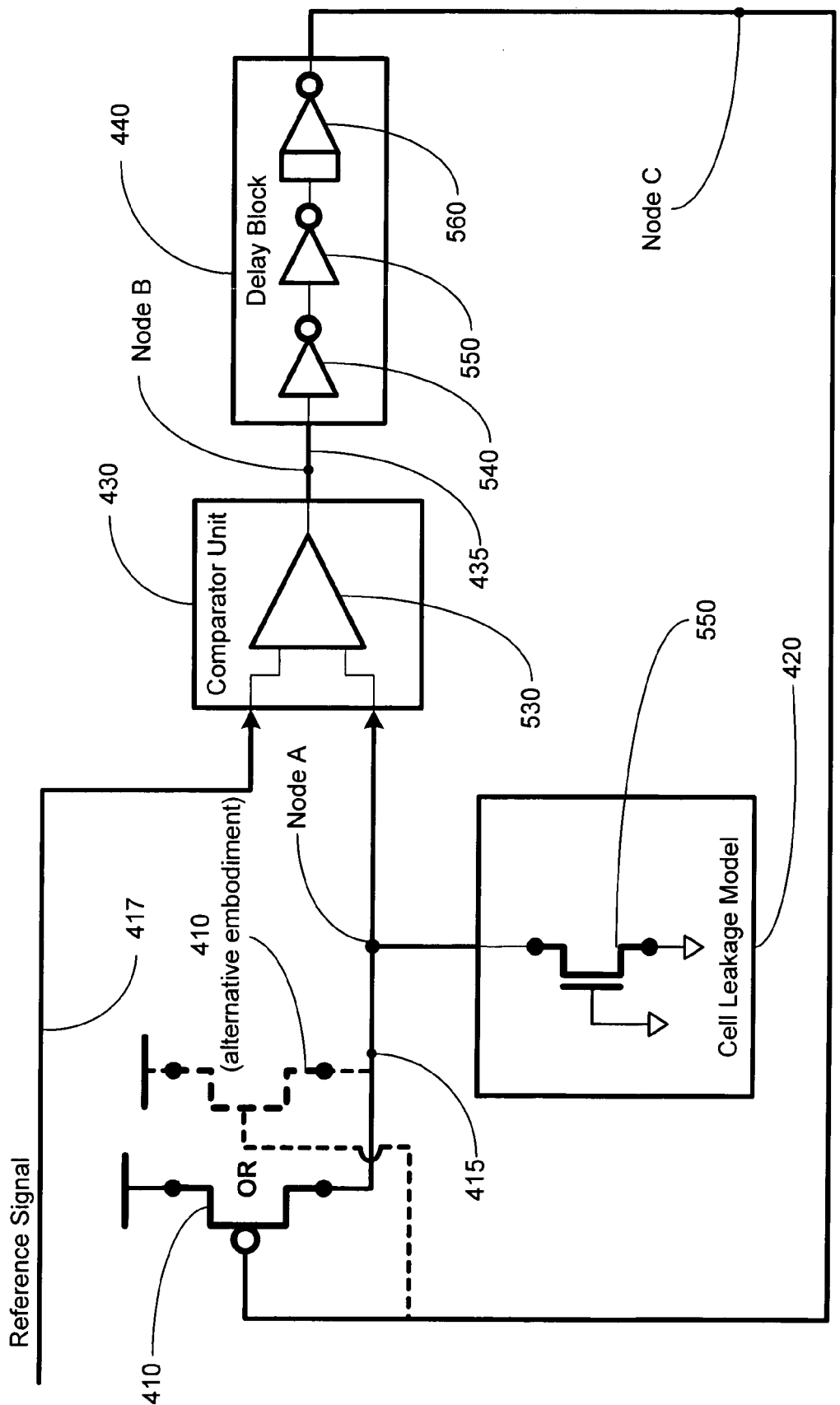
FIG. 5 illustrates a more detailed block diagram depiction of a cell leakage model of FIG. 4, in accordance with one illustrative embodiment of the present invention.
Figure 6:
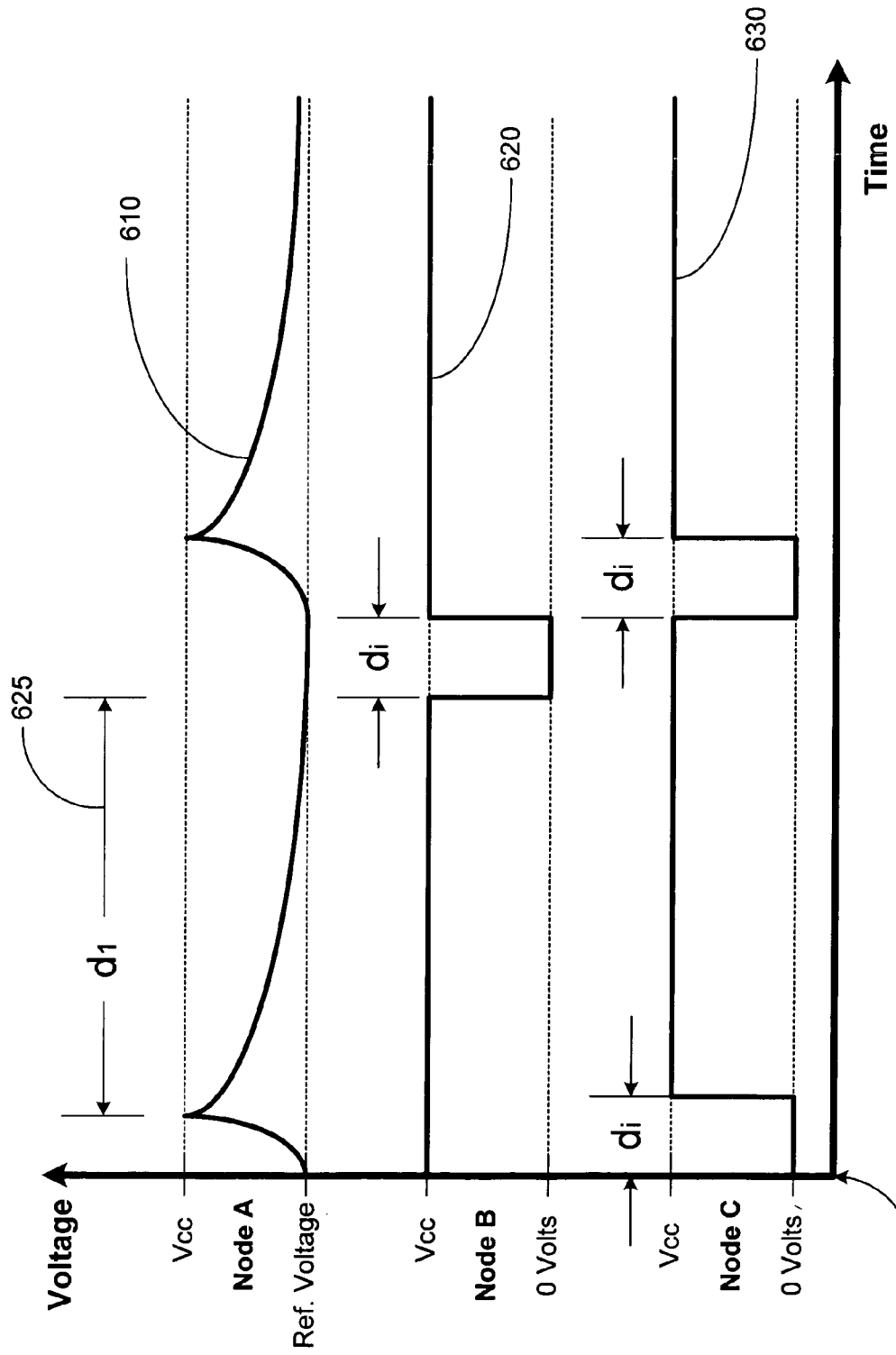
FIG. 6 illustrates a timing diagram relating to the cell leakage model, in accordance with one illustrative embodiment of the present invention.

The leakage model circuit 320 models the approximate behavior of the current leakage experienced by refresh operations performed by the memory device 110. FIG. 5 illustrates a more detailed description of one embodiment of the leakage model circuit 320 illustrated in FIG. 4. Additionally, FIG. 6 illustrates a timing diagram associated with the operation of the leakage model circuit 320. Referring concurrently to FIGS. 4, 5, and 6, at an initial reference time period (t=0), the transistor 410 is switched, which indicates a turning on of the transistor 410 at t=0. When the P-channel transistor 410 is turned on, line 415 is pre-charged such that node A (line 415) is pulled towards $V_{cc}$. In an alternative embodiment, where the transistor 410 is an N-channel device, node A is precharged towards $V_{cc}$ minus a diode drop value.

Referring to the timing diagram in FIG. 6, three timing diagrams 610, 620, 630 are illustrated. The timing diagrams 610, 620, 630 correspond to the signal behavior of the lines 415 (node A), 435 (node B), and 445 (node C), respectively. Upon the pre-charging of node A (line 415), as indicated by the diagram 610, the signal on the line 415 rises from a reference voltage level on the line 417 towards $V_{cc}$. The time that elapses between when the comparator 430 switches and the transistor 410 turns on is approximately the delay time of the delay block 440. The delay may be inserted to provide sufficient pre-charge time via transistor 410 for node A. In alternative embodiments, this may be achieved by other means, such as adding hysteresis to the comparator 430.

The signal on node A (line 415) then takes a decaying drop down towards the reference voltage level. This decay rate is generally a function of temperature. The signal on node A (line 415) is compared to the reference voltage by a differential amplifier 530 in a comparator unit 430. In an alternative embodiment, the comparator unit 430 may comprise any type of device that is capable of performing a comparator operation between at least two signals. The comparator unit 430 affects the triggering of the signal on the line 435 (node B) based upon the comparison between the node A (line 415) and the reference signal on the line 417. When the signal on node A falls below the reference voltage (line 417), node B (line 435) experiences an active negative edge as illustrated by the diagram 620 in the timing diagram of FIG. 6. In the case where the comparator unit 430 implements a non-inverting amplifier, node B (line 435) goes low. The delay $d_l$ (625) may the amount of time it takes node A to leak from $V_{cc}$ to the trip point of the comparator 430, which in one embodiment may be 50 miro-seconds, for example. This delay may be set by manipulating semiconductor manufacturing paramter(s).

At the initial time in the timing diagram of FIG. 6 (t=0), when the signal on node A goes below the reference voltage (line 417), the amplifier 530 is switched in the comparator unit 430. The delay $d_i$ is provided to allow the transistor 410 adequate time to pre-charge node A. The time period of the delay $d_i$, which in one embodiment may be 10 nanoseconds, is the approximate amount of pre-charge time that node A will have in addition to the delay provided by the delay block 440. Therefore, there is a delay between the activation of the signal from node A to the signal on node C, which is provided by the comparator unit 430 and the delay block 440. This delay provides the opportunity for the signal on node A to pre-charge substantially fully. Without adequate delay, the signal on node A may not fully pre-charge because when the signal on node C would go to logic low, it would turn on the transistor 410, (e.g, a P-channel transistor), which would then start to raise the signal level on node A. However, without the delay, if node A rises to a certain level, such as a 100 millivolts above the reference voltage, the comparator unit 430 may switch the leakage model circuit 320 and it would come around and shut off the P-channel transistor 410, such that node A would not have an opportunity to pre-charge to $V_{cc}$. In the example where the transistor 410 were an N-channel device, the node A would not pre-charge to $V_{cc}$, but would pre-charge to a voltage level that is $V_{cc}$ minus a diode drop.

When node A gets pre-charged to approximately $V_{cc}$, the transistor 410 shuts off. The reason for the exponential decay indicated in diagram 610 of FIG. 6 is that the junction and/or the source-drain leakage of a transistor 550 contained within the cell leakage model 420. The cell leakage model 420 models the behavior or the leakage in the memory array 210. Therefore, the behavior of the leakage model circuit 320 provides an approximate indication of the memory cell 240 refresh leakage current of the memory device 110. The first delay ($d_l$) 625 may provide an indication of the exponential decay time (from the point where node A is $V_{cc}$ until it reaches the reference voltage level), may vary with temperature and other external factors. The first delay ($d_l$) 625 would track the temperature-dependence of the memory array 210 for refresh cycles. Therefore, the first delay 625 may be a function of temperature.

Additionally, the first delay ($d_l$) 625 may also be an inherent function of the value of $V_{cc}$ since the exponential drop will take longer at a higher $V_{cc}$ level and conversely, would take a shorter amount of time at a lower $V_{cc}$ level. Therefore, the leakage model circuit 320 models the refresh current leakage experienced by the refresh cycle implemented by the memory controller 220 upon the memory array 210 in the memory device 110. The refresh leakage may be due to junction leakage or the source-drain leakage in various transistors associated with the memory array 210. Therefore, using the information relating to the leakage values associated with the delay, the operation of the refresh control oscillator 310 may be adjusted to increase or decrease the refresh rate. Therefore, for lower temperature, the current leakage is tracked by the first delay ($d_l$) 625 and therefore, the refresh control oscillator 310 is adjusted to reduce the refresh rate.

Referring to FIG. 5, the cell leakage model 420 may comprise the transistor circuit 550, which approximates the N+ diffused junction of the memory cell 240 in the memory array 210. This follows since, as shown in Equation 1:

$$C/I_{leak} = V/T \qquad \text{Equation 1;}$$

(where the leakage current, $I_{leak}$, and the capacitance, C, are proportional to the junction area, V is the voltage, and the T is time) the leakage current and the capacitance may define the decay rate (V/T) of node A (see curve 610 in FIG. 6). This decay rate, in one embodiment, is substantially constant and may be generally independent of the junction area.

The access devices 120 are generally shut-off as they would be in the case of the actual memory array 210. The transistor circuit 550 in the cell leakage model 420 illustrated in FIG. 5 would be a device that comprises an appreciable amount of drain capacitance. This is true because if the cell leakage model 420 had a smaller capacitance, the switching of the comparator unit 430 could capacitively couple to node A disrupting the proper operation of the leakage model circuit 320. The implementation of the comparator unit 430 may be provided by a differential amplifier 530 as illustrated in FIG. 5. The differential amplifier 530 uses a reference voltage-input on the line 417 and the second input being the line 415.

In an alternative embodiment, a CMOS inverter may be implemented with an adjustable trip point to perform the operation of the comparator function described above. The delay unit 440 may comprise a series of inverters, such as 20 inverters each with a delay of one nanosecond (first, second, and third or Nth inverters 540, 550, 560). The gate node of the transistor 410 is coupled to the source input to the transistor circuit 550 in the cell leakage model 420. The line 415 is also connected to a first input of the comparator unit 430 (differential amplifier 530). A second input to the comparator/differential amplifier 530 is connected to the reference voltage on the line 417. The output of the differential amplifier 530 is connected to a first input of the first inverter 540 whose output is coupled to the input of the second inverter 550. The output of the second inverter 550 is coupled to the input of the third or Nth inverter 560. The output of the Nth inverter 560 is fed-back to the gate input of the transistor 410, whose source is pulled up to $V_{cc}$.

The current leakage of leakage model circuit 320 provided in embodiments of the present invention may be used to track the memory cell 240 refresh rate with $V_{cc}$ variation. Intrinsically, the memory core refresh rate may be reduced at a higher $V_{cc}$, accordingly, the leakage model circuit 320 will slow down the oscillating rate of the refresh control oscillator 310 for higher $V_{cc}$ levels. The leakage model circuit 320 tracks a variation in the memory cell 240 device refresh rate for variations in process, voltage, and/or temperature. The leakage model circuit 320 will cycle at a higher frequency than the memory cell 240 refresh time since the reference voltage on the line 417 generally controls the cycle rate of the refresh control oscillator 310. Alternatively, other reference voltages may be used to adjust the frequency of the refresh control oscillator 310 to a desired level. The base oscillation frequency of the refresh control oscillator 310 may be adjusted with other digital divider circuits that may be implemented into the leakage model circuit 320 or the refresh control unit 230.

Figure 7:
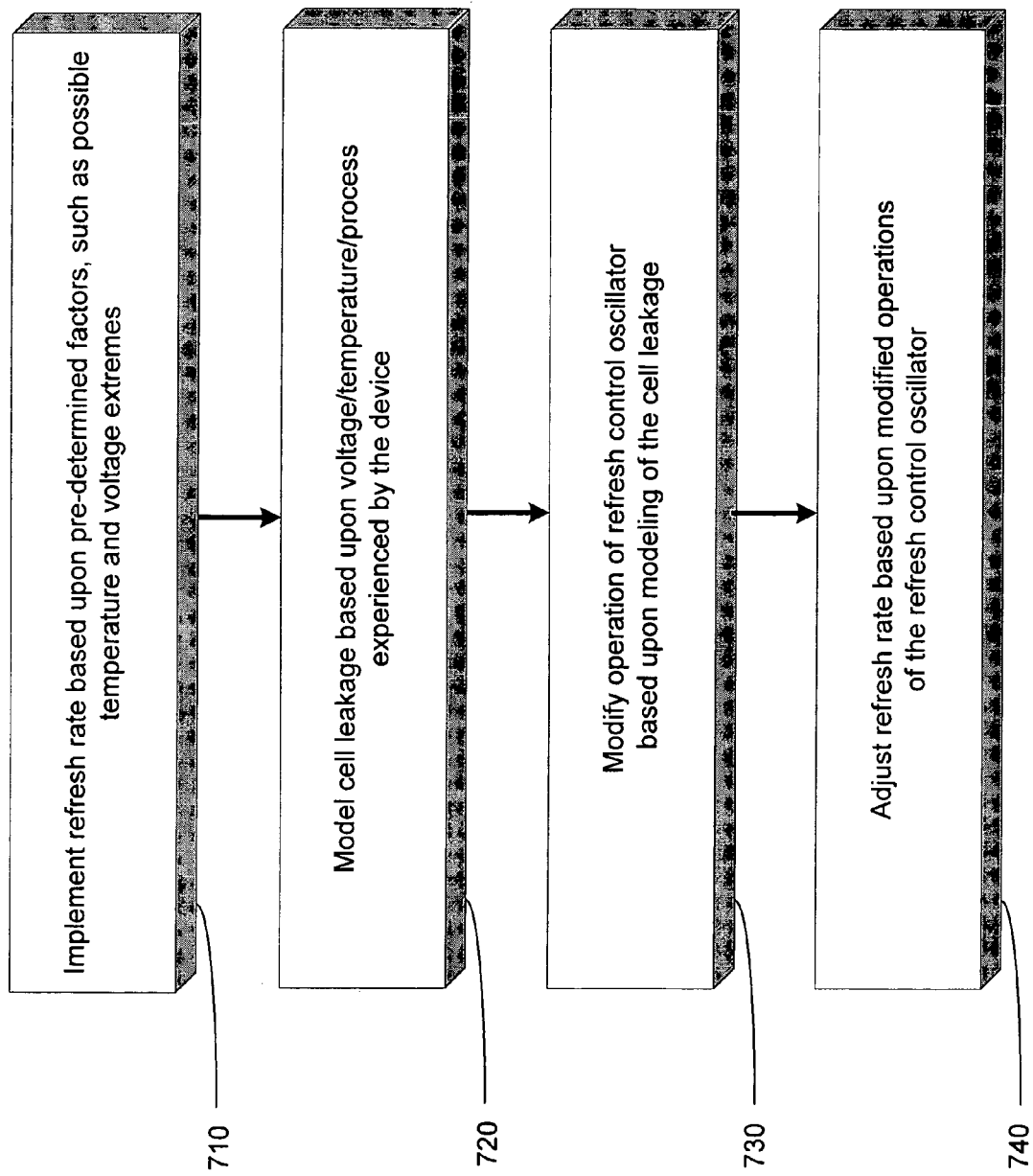
FIG. 7 illustrates a flowchart depiction of a method in accordance with one illustrative embodiment of the present invention.

Turning now to FIG. 7, a flow chart representation of the methods in accordance with embodiments of the present invention is illustrated. The system 100 may implement a refresh rate for refreshing the memory array 210 within a memory unit 110 (block 710). The refresh rate may be based upon a predetermined refresh rate that may be calculated to account for temperature extremes or voltage extremes that may be experienced by the memory device 110. Initially, during the operation of the memory device 110, the predetermined refresh rate is used to perform refresh operations.

Upon operation of the system 100, the memory device 110 may model the cell leakage that may be experienced by the various memory cells 240 in the memory array 210 (block 720). The cell leakage model 320 may be based upon temperature variations, voltage variations and/or process variations used to manufacture the memory device 110. Based upon the modeling of the cell leakage, the memory device 110 may modify the operation of the refresh control oscillator 310 (block 730). The memory device 110 then adjusts the refresh rate based upon the modification of the refresh control oscillator 310 (block 740). Therefore, a dynamic adjustment of the refresh rate may be implemented based upon variations detected by the cell leakage model 420. Hence, a dynamic adjustment of the refresh rates may be implemented by the memory device 110 based upon changes in temperature, supply voltage, or variations in the processes utilized to manufacture the memory device 110. This dynamic adjustment allows the memory device 110 to react to changing operating conditions, which may lead to more efficient refresh operations, thereby increasing the possibility of reducing power consumption.

Utilizing embodiments of the present invention, a dynamic adjustment of refresh rates in a memory device 110 may be achieved, which dynamically adjusts the refresh rates based upon temperature, supply voltage, and/or processes used to manufacture the device, to efficiently implement an appropriate refresh rate. Therefore, significant power savings may be realized by implementing an efficient refresh rate in electronic devices, such as memory devices 110.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A device, comprising:
   a circuit for performing an approximation of a current leakage associated with at least a portion of said device; and
   a refresh rate control unit operatively coupled with said circuit, said refresh rate control unit comprising a refresh oscillator, said refresh rate control unit to adjust a refresh rate associated with at least a portion of said device in response to said approximation of said current leakage.

2. The device of claim 1, wherein said device is a memory device.

3. The device of claim 1, wherein said circuit further comprises:
   a first transistor to provide a first input signal;
   a cell leakage model operatively coupled to said transistor, said cell leakage model to model a current leakage associated with at least a portion of said device;
   a comparator to compare said first input signal to a reference input signal; and
   a delay unit operatively coupled to said comparator, said delay unit to provide a delay upon an output from said comparator to provide a time period for pre-charging of said transistor and to provide a signal for controlling said refresh rate.

4. The device of claim 1, wherein said leakage model circuit is capable of controlling said refresh rate associated with at least a portion of said device by adjusting the operation of said refresh oscillator.

5. The device of claim 1, wherein said circuit is capable of modeling a leakage current that is induced by a temperature level.

6. The device of claim 1, wherein said circuit is capable of modeling a leakage current that is induced by an operating voltage level.

7. The device of claim 1, wherein said circuit is capable of modeling a leakage current that is induced by a particular process feature associated with said device.

8. The device of claim 2, wherein said memory device is at least one of, a dynamic random access memory (DRAM), a double-data rate SDRAM (DDR SDRAM), a Rambus DRAM (RDRAM), and a FLASH memory.

9. The device of claim 3, wherein said transistor is a P-channel transistor that is pulled up to a supply voltage.

10. The device of claim 3, wherein said transistor is an N-channel transistor that is pulled up to a supply voltage.

11. The device of claim 3, wherein said cell leakage model comprises a second transistor for modeling the current leakage of at least a portion of said device.

12. The device of claim 3, wherein said comparator comprises a differential amplifier.

13. The device of claim 3, wherein said comparator comprises a CMOS inverter.

14. The device of claim 3, wherein said delay unit comprises a plurality of inverters, wherein each of said plurality of inverters provides a delay.

15. A circuit for controlling a refresh rate associated with at least a portion of a memory device, said circuit comprising:
   a transistor to provide a first input signal;
   a cell leakage model operatively coupled to said transistor, said cell leakage model to model a current leakage associated with at least a portion of said device;
   a comparator to compare said first input signal to a reference input signal;
   a delay unit operatively coupled to said comparator, said delay unit to provide a delay upon an output from said comparator to provide a time period for pre-charging of said transistor and to provide a signal for controlling said refresh rate; and
   a refresh control oscillator operatively coupled to said delay unit, said refresh control oscillator to provide said refresh rate for refreshing at least said portion of said memory device.

16. The circuit of claim 15, wherein said cell leakage model is capable of modeling a leakage current that is induced by a temperature level.

17. The circuit of claim 15, wherein said cell leakage model is capable of modeling a leakage current that is induced by an operating voltage level.

18. The circuit of claim 15, wherein said cell leakage model is capable of modeling a leakage current that is induced by a particular process feature associated with said device.

19. A system board, comprising:
   a processor;
   a memory device operatively coupled to said processor, said memory device comprising:
      a leakage model circuit for performing an approximation of a current leakage associated with a portion of said device; and
      a refresh rate control unit operatively coupled with said leakage model circuit, said refresh rate control unit comprising a refresh oscillator, said refresh rate control unit to adjust a refresh rate associated with at least a portion of said memory device in response to said approximation of said current leakage.

20. The system board described in claim 19, wherein said memory device is at least one of a DRAM, a DDR SDRAM, a RDRAM, and a FLASH memory.

21. The system board of claim 19, wherein said system board is a motherboard of a computer system.

22. The system board of claim 19, wherein said leakage model circuit further comprises:
   a transistor to provide a first input signal;
   a cell leakage model operatively coupled to said transistor, said cell leakage model to model said current leakage associated with at least a portion of said device;
   a comparator to compare said first input signal to a reference input signal; and
   a delay unit operatively coupled to said comparator, said delay unit to provide a delay upon an output from said comparator to provide a time period for pre-charging of said transistor and to provide a signal for controlling said refresh rate.

23. The system board of claim 19, wherein said leakage model circuit is capable of controlling said refresh rate associated with at least a portion of said device by adjusting the operation of said refresh oscillator.

24. The system board of claim 19, wherein said leakage model circuit is capable of modeling said leakage current that is induced by a temperature level.

25. The system board of claim 19, wherein said leakage model circuit is capable of modeling a leakage current that is induced by an operating voltage level.

26. The system board of claim 19, wherein said leakage model circuit is capable of modeling a leakage current that is induced by a particular process feature associated with said device.

27. The system board of claim 22, wherein said transistor is a P-channel transistor that is pulled up to a supply voltage.

28. The system board of claim 22, wherein said comparator comprises a differential amplifier.

29. The system board of claim 22, wherein said delay unit comprises a plurality of inverters, wherein each of said plurality of inverters provides a delay.

30. A memory device, comprising:
   a leakage model circuit for performing an approximation of a current leakage associated with a portion of said device; and
   a refresh rate control unit operatively coupled with said leakage model circuit, said refresh rate control unit comprising a refresh oscillator, said refresh rate control unit to adjust a refresh rate associated with at least a portion of said device in response to said approximation of said current leakage.

31. The memory device of claim 30, wherein said memory device is at least one of a dynamic random access memory (DRAM), a double-data rate SDRAM (DDR SDRAM), a Rambus DRAM (RDRAM), and a FLASH memory.

32. The memory device of claim 30, wherein said leakage model circuit further comprises:
   a transistor to provide a first input signal;
   a cell leakage model operatively coupled to said transistor, said cell leakage model to model said current leakage associated with at least a portion of said device;
   a comparator to compare said first input signal to a reference input signal; and
   a delay unit operatively coupled to said comparator, said delay unit to provide a delay upon an output from said comparator to provide a time period for pre-charging of said transistor and to provide a signal for controlling said refresh rate.

33. The memory device of claim 30, wherein said leakage model circuit is capable of controlling said refresh rate associated with at least a portion of said device by adjusting the operation of said refresh oscillator.

34. The memory device of claim 30, wherein said leakage model circuit is capable of modeling a leakage current that is induced by a temperature level.

35. The memory device of claim 30, wherein said leakage model circuit is capable of modeling a leakage current that is induced by an operating voltage level.

36. The memory device of claim 30, wherein said leakage model circuit is capable of modeling a leakage current that is induced by a particular process feature associated with said device.

37. The memory device of claim 32, wherein said transistor is a P-channel transistor that is pulled up to a supply voltage.

38. The memory device of claim 32, wherein said comparator comprises a differential amplifier.

39. The memory device of claim 32, wherein said delay unit comprises a plurality of inverters, wherein each of said plurality of inverters provides a delay.

40. A method, comprising:
   detecting a change in a current leakage relating to at least a portion of a memory device; and
   adjusting a refresh rate associated with said portion of said memory device in response to detecting said current leakage.

41. The method of claim 40, wherein detecting a change in said current leakage further comprises modeling said current leakage relating at least a portion of said memory device.

42. The method of claim 40, wherein adjusting a refresh rate associated with said portion of said memory device further comprises modifying the operation of a refresh oscillator.

43. The method of claim 41, wherein modeling said current leakage further comprises detecting a change in said current leakage in response to a change in a temperature level.

44. The method of claim 41, wherein modeling said current leakage further comprises detecting a change in said current leakage in response to a change in an operating voltage level.

45. An apparatus, comprising:
   means for detecting a change in a current leakage relating to at least a portion of a memory device; and
   means for adjusting a refresh rate associated with said portion of said memory device in response to detecting said current leakage.

46. A computer readable program storage device encoded with instructions that, when executed by a computer, performs a method, comprising:
   detecting a change in a current leakage relating to at least a portion of a memory device; and
   adjusting a refresh rate associated with said portion of said memory device in response to detecting said current leakage.

47. The computer readable program storage device encoded with instructions that, when executed by a computer, performs the method of claim 46, wherein detecting a change in said current leakage further comprises modeling said current leakage relating at least a portion of said memory device.

48. The computer readable program storage device encoded with instructions that, when executed by a computer, performs the method of claim 46, wherein adjusting said refresh rate associated with said portion of said memory device further comprises modifying the operation of a refresh oscillator.

49. The computer readable program storage device encoded with instructions that, when executed by a computer, performs the method of claim 47, wherein modeling said current leakage further comprises detecting a change in said current leakage in response to a change in a temperature level.

50. The computer readable program storage device encoded with instructions that, when executed by a computer, performs the method of claim 47, wherein modeling said current leakage further comprises detecting a change in said current leakage in response to a change in an operating voltage level.

51. A computer system, comprising:
   a display device;
   a computer unit operatively coupled to said display device, said computer unit comprising a system board, said system board comprising:
      a processor;
      a memory device operatively coupled to said processor, said memory device comprising:
         a leakage model circuit for performing an approximation of a current leakage associated with a portion of said device; and
         a refresh rate control unit operatively coupled with said leakage model circuit, said refresh rate control unit comprising a refresh oscillator, said refresh rate control unit to adjust a refresh rate associated with at least a portion of said memory device in response to said approximation of said current leakage.

52. The computer system described in claim 51, wherein said display device is a monitor.

53. The computer system described in claim 51, wherein said memory device is at least one of a DRAM, a DDR SDRAM, a RDRAM, and a FLASH memory.

54. The computer system of claim 51, wherein said system board is a motherboard of a computer system.

55. The computer system of claim 51, wherein said leakage model circuit further comprises:
   a transistor to provide a first input signal;
   a cell leakage model operatively coupled to said transistor, said cell leakage model to model said current leakage associated with at least a portion of said device;
   a comparator to compare said first input signal to a reference input signal; and
   a delay unit operatively coupled to said comparator, said delay unit to provide a delay upon an output from said comparator to provide a time period for pre-charging of said transistor and to provide a signal for controlling said refresh rate.

56. The computer system of claim 51, wherein said portion of said memory device comprises at least one memory cell.

* * * * *